United States Patent [19]

Tsuji et al.

[11] Patent Number: 5,539,221

[45] Date of Patent: Jul. 23, 1996

[54] STAIRCASE AVALANCHE PHOTODIODE

[75] Inventors: Masayoshi Tsuji; Kikuo Makita, both of Tokyo, Japan

[73] Assignee: NEC Corporation, Tokyo, Japan

[21] Appl. No.: 224,110

[22] Filed: Apr. 7, 1994

[30] Foreign Application Priority Data

Apr. 7, 1993 [JP] Japan ................................. 5-079960

[51] Int. Cl.⁶ .................... H01L 31/107; H01L 31/0328; H01L 31/072; H01L 31/109
[52] U.S. Cl. ........................... 257/186; 257/438; 257/13; 257/21; 257/439; 257/450
[58] Field of Search .................................. 257/185, 186, 257/184, 21, 13, 15, 438, 439, 450

[56] References Cited

U.S. PATENT DOCUMENTS 4,722,907  2/1988  Weil et al. ................................. 257/21

FOREIGN PATENT DOCUMENTS

| 3-66179 | 3/1991 | Japan | 257/186 |
| 3-201489 | 9/1991 | Japan | 257/186 |
| 3-231477 | 10/1991 | Japan | 257/186 |
| 4-125977 | 4/1992 | Japan | 257/186 |

OTHER PUBLICATIONS

Wada et al., "Very High Speed GaInAs Metal–Semiconductor–Metal Photodiode Incorporating an AlInAs/GaInAs Graded Superlattice," Appl. Phys. Lett. vol. 54, No. 1, Jan. 2, 1989, pp. 16–17.
IEEE Electron Device Letters, vol. EDL–7, No. 4, Apr. 1986;Planar InP/InGaAs Avalanche Photodiodes with Preferential Lateral Extended Guard Ring;Kenko Taguchi, Toshitaka Torikai, Yoshimasa Sugimoto, Kikuo Makita, Hisahiro Ishirara;Sadao Fujita and Kouichi Minemura.
1895;Appl. Phys. Lett 57(18) , 29 Oct. 1990;InGaAs/InAIAs Superlattice Avalanche Photodiode with a Separated Photoabsorption Layer;Toshiaki Kagawa, Yuichi Kawamura, Hiromitsu Asai, and Mitsura Naganuma.
IEE Transactions On Electron Devices, vol. Ed–30, No. 4, Apr. 1983; Staircase Solid–State Photomultipliers and Avalanche Photodiodes with Enhanced Ionization Rates Ratio; Federico Capasso, Won–Tien Tsang and Gareth F. Williams.
Electronics Letters 2nd Aug. 1984; vol. 20 No. 16; High--Speed Planar–Structure InP/InGaAsP/InGaAs Avalanche Photodiode Grown by VPE.

*Primary Examiner*—Sara W. Crane
*Assistant Examiner*—Alice W. Tang
*Attorney, Agent, or Firm*—Popham, Haik, Schnobrich & Kaufman, Ltd.

[57] ABSTRACT

An avalanche photodiode is provided which consists of a staircase APD with a periodic multilayer structure graded in composition from InAlAs to $InGa_xAl_{(1-x)}As$ ($x>0.1$) as the multiplication layer to improve the dark current characteristic. Another photodiode with separate photoabsorption and multiplication regions is provided with an electric-field relaxation layer whose bandgap is wider than that of the photoabsorption and has a triple structure with a highly-doped layer sandwiched between lightly-doped layers. This photodiode incorporates in detail on an n-type InP substrate, an avalanche multiplication layer 13 of a periodic multilayer structure graded in composition from $n^-$-InAlAs to $InGa_xAl_{(1-x)}As$, a $p^-$-InGaAs photoabsorption layer 17, and an InP electric-field relaxation triple layer 16 consisting of $n^-$, $p^+$, and $p^-$ layers between the avalanche multiplication layer 13 and the photoabsorption layer 17.

4 Claims, 3 Drawing Sheets

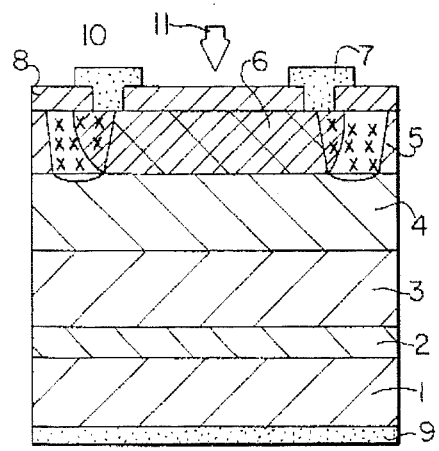
FIG. 1
(PRIOR ART)
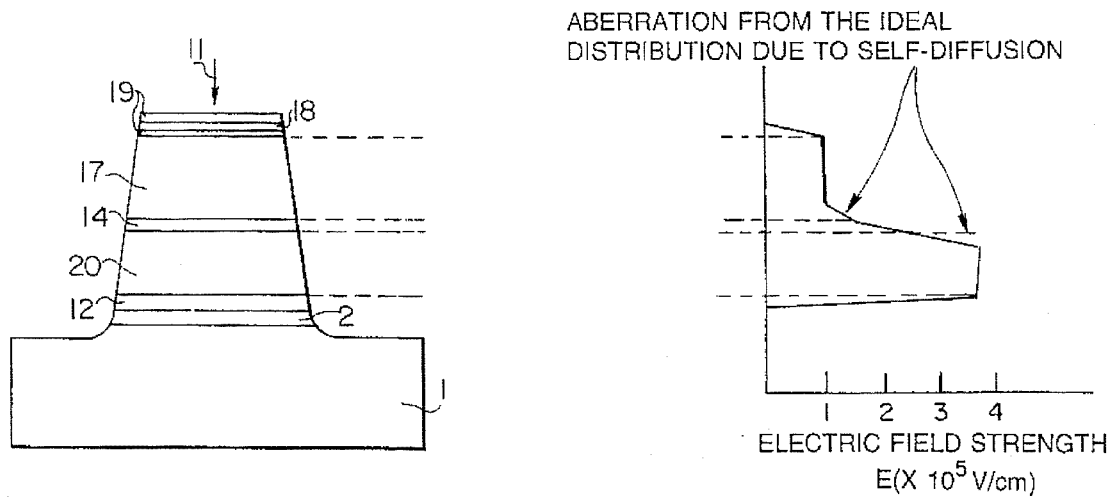
FIG. 2A
(PRIOR ART)
FIG. 2B
(PRIOR ART)
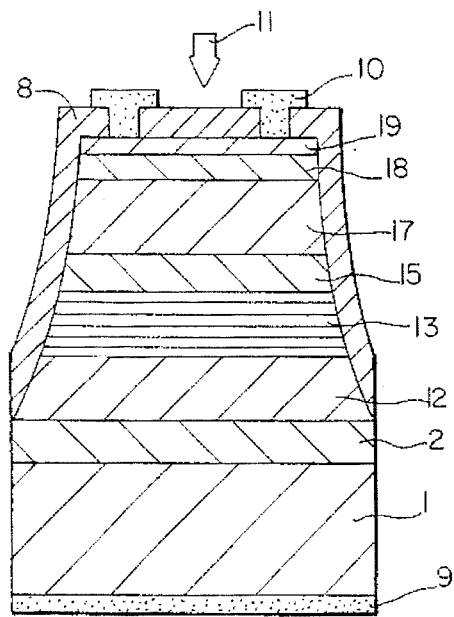
FIG. 3

STAIRCASE AVALANCHE PHOTODIODE

BACKGROUND OF THE INVENTION

This invention relates to an avalanche photodiode (APD) for use in optical communications, optical-information processing, optical measurement, etc., and more particularly to a staircase APD having good characteristics of low noise and high-speed response.

As photodiodes for use in the 1 to 1.6 μm-band optical communications are known so far a pin photodiode comprising on a InP substrate, a lattice-matched $In_{0.53}Ga_{0.47}As$ layer (referred to as InGaAs layer hereinafter) as a photoabsorption layer disclosed in the article Electronics Letters 20, 653–654 (1984), and an APD seen in IEEE Electron Device Letters 7, 257–258 (1986). Especially the latter is put in practical use for telecommunications because of its structure of providing internal gain due to avalanche multiplication action, and the consequent high sensitivity.

FIG. 1 shows a structural cross-section of a typical InGaAs APD. This device is formed by the following process: On an n-type InP substrate 1, an n-type InP buffer layer 2, and n-type InGaAs photoabsorption layer 3, an n-type InP avalanche multiplication layer 4 and an n-type InP cap layer 5 are fabricated on top of one another by the vapor phase epitaxy (VPE) technique. Following this, a p⁺region 6 is formed, for example, by thermal diffusion of Zn, and the p-type guardring regions 7 are formed by beryllium-ion implantation followed by thermal treatment. Over the whole surface a passivation film 8 is deposited. Finally an n-side ohmic electrode 9 and a p-side ohmic electrode 10 are deposited by the vacuum evaporation, thus a completed device being obtained.

The operation of the APD will be described. When light 11 is incident on the surface, charge carriers are created in InGaAs light-absorption layer 3. In particular, holes are injected into InP avalanche layer 4 under electric field. In InP avalanche layer 4 to which high field is applied, ionization by collision occurs, which results in carrier multiplication. It is known that this carrier multiplication process due to the ionization resulting from the random collision of carriers governs important characteristics of the device: low noise and fast response. In other words, a greater difference between ionization rates of electrons and holes in the avalanche layer reflects higher ratios of the ionization rates. (Let α and β be ionization rates of electrons and holes respectively. If α/β>1, electron will be the majority carrier that causes ionization by collision and if α/β>1, hole will be so). This is desirable for the characteristics of the device. The ionization rate ratio α/β or β/α) however depends on the properties of the material, for example, β/α≅at most about 2 for InP which differs much from the α/β≅20 for Si having a low-noise advantage. Neco approaches using epoch-making material therefore are required to realize characteristics of lower noise and higher-speed response.

For such purpose, F. Capasso et. al. proposed a staircase APD permitting higher-sensitivity and higher bandwidth due to an increase of the ionization rate ratio α/β by utilizing the conduction-band discontinuity energy (Δ[O]Ec) to enhance the electron ionization. Such an example is described in the article IEEE TRANSACTIONS ON ELECTRON DEVICES ED-30, 381 (1983).

In this staircase APD, the value of the conduction-band discontinuity energy (Δ[O]Ec) contributes greatly to improvement in the ionization rate ratio. Additionally it is constructed to make it possible to solve the electron pile-up at the hetero-interfaces of the multiplication layer, associated with the superlattice APD with a multiplication layer of rectangular superlattice structure disclosed in the article Appl. Phys. Lett. 57, 1895 (1990).

In the staircase APD proposed by F. Capasso et al., however, the periodic structure of the layer graded in composition from $InGa_xAl_{(1-x)}As$ to InGaAs is used as an avalanche layer. When a high electric field (>500 kV/cm) is applied therefore, the tunneling dark current increases at the minimum bandgap of 0.75 eV (of InGaAs), and in turn, the dark current providing a multiplication factor of 10 is estimated to get above 1 μA. The bandgap of such an InGaAs layer allows a large dark current to flow, and this can cause a large power penalty in optical communication so as to make it practically impossible to use, thereby constituting a disadvantage.

By the way, the example proposed by F. Capasso et. al. is not enough by itself for obtaining an APD that is practically usable for optical communication, and hence it is needed to separate the photoabsorption layer and the avalanche layer like the above-mentioned InGaAs-APD example, and to control the electric field strengths impressed on the layers to suitable values to share the function for the above-mentioned purpose by them. Such an example of the above-mentioned superlattice APD was reported in the article Appl. Phys. Lett. 57, p.1895 (1990). FIG. 2 shows the structure of this superlattice APD with separate photoabsorption and avalanche layers, together with the distribution of electric field strength. Reference characters in FIG. 2 designate as follows: 1 and n⁺-type InP substrate, 2 and n⁺-type InP buffer layer, 12 an n⁺-type InAlAs Layer, 14 an p-type InGaAs electric field relaxation layer, 17 a p⁻-type InGaAs photoabsorption layer, 18 a p⁺-InAlAs window layer, 19 p⁺-type InGaAs ohmic contact layers, and 20 an InGaAs/InAlAs superlattice avalanche multiplication layer.

For the purpose of ensuring a sufficiently-large electric field strength (>400 kV/cm) to induce ionization in superlattice avalanche multiplication layer 20, and a small electric field strength (<150 kV/cm) to drift photogenerated carriers and prevent tunnel breakdown in photoabsorption layer 17, there is provided a structure with a p-type InGaAs electric-field relaxation layer 14 sandwiched between both layers 20 and 27.

This structure has the disadvantage that because of field relaxation layer 14 having the same composition InGaAs as that of the light-absorbing layer 17, tunnel breakdown may occur due to the high field in the electric-field relaxation layer, resulting in increased dark current. Additionally in practical photodiode-fabrication processes, diffusion of a dopant may take place from the highly-doped electric-field relaxation layer to the absorbing layer side and the avalache multiplication layer side. The former may be a cause of inducing tunnel breakdown and the latter may be a cause of failing to obtain the electric field as high as designed, with a consequent inadequate multiplication.

SUMMARY OF THE INVENTION

It is the principal object of the present invention to solve the above-mentioned problems and to provide a staircase APD of lower noise and faster response.

A staircase APD according to the present invention comprises a photoabsorption layer and an avalanche multiplication semiconductor layer on a semiconductor substrate wherein the avalanche multiplication semiconductor layer is a periodic multilayer structure graded in composition from InAlAs to $InGa_xAl_{(1-x)}As$ (0.1<x<1).

Another APD according to the present invention comprises, on a semiconductor substrate, a photoabsorption layer, an avalanche multiplication semiconductor layer, and an electric-field relaxation layer sandwiched between the photoabsorption layer and the avalanche multiplication semiconductor layer wherein the bandgap of the electric-field relaxation layer is wider than the bandgap of the photoabsorption layer.

A further APD according to the present invention wherein the electronic-field relaxation layer having a bandgap wider than the bandgap of the photoabsorption layer has a structure with the highly-doped layer sandwiched between the lightly-doped layers.

BRIEF DESCRIPTION OF THE DRAWINGS

FIG. 1 is a cross-sectional view of a conventional APD;

FIG. 2A is a cross-sectional view of a conventional superlattice APD;

FIG. 2B shows the electric field strength distribution of FIG. 2A;

FIG. 3 is a cross-sectional view of the first embodiment of the present invention;

DESCRIPTION OF THE PREFERRED EMBODIMENTS

Figure 8:
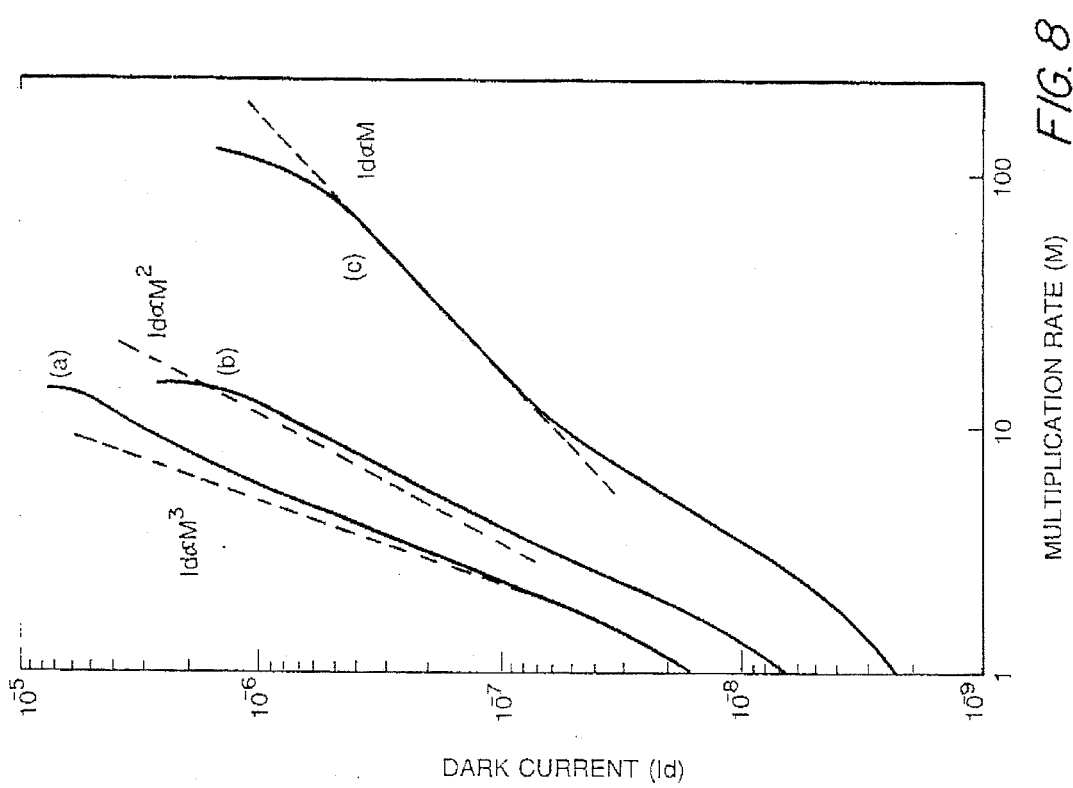
FIG. 8 is a graph of dark current vs. multiplication rate characteristics for illustrating the effects of the second and third embodiments.

FIG. 3 shows a cross-section of the first embodiment of the present invention. The structure consists of, on top of one another, an n-type InP substrate 1, an n-type InP buffer layer 2 (0.5 μm thickness), an $n^+$-InAlAs layer 12 (0.5 μm thickness), and an avalanche multiplication multilayer 13 (0.24 μm thickness) with 12 periods of 200 Å thickness, graded in composition form $n^-$-type InAlAs to $InGa_{0.3}Al_{0.2}As$. Successively a $p^+$-type InP electric-field relaxation layer 15 (2000 Å thickness), a $p^-$-type InGaAs photoabsorption layer 17 (1.3 μm thickness), an InP cap layer 18 (0.2 μm thickness), and an In GaAs contact layer 19 (0.1 μm thickness) are formed. After this, wet-etching is made to form a mesa of 40 μm in diameter, and a passivation film 8 (1500 Å thickness) is vacuum-evaporated. Finally an n-side electrode 9 is made by deposition of AuGe/Ni (1500 Å thickness), followed by TiPtAu (500 Å thickness), and an p-side electrode 10 is made by deposition of AuZn (1500 Å thickness). Thus the device structure shown in FIG. 3 is completed.

Figure 4:
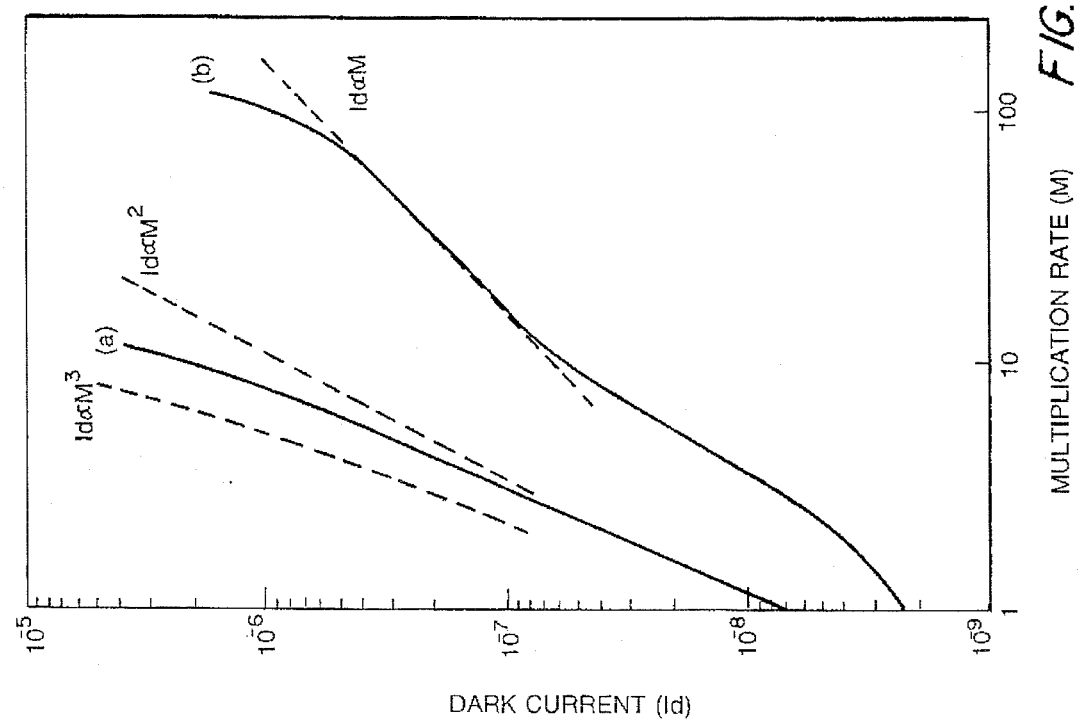
FIG. 4 is a graph of dark current vs. multiplication rate characteristics for illustrating the effects of the first embodiment.

FIG. 4 is a graph for illustrating the effects of the first embodiment of the present invention in which the dark current characteristics of the two different multiplication-layer structures of staircase APD with photoabsorption and multiplication layers integrated are plotted. The integrated structure is one that sandwiches the avalanche multiplication layer between the $p^+$ and $n^+$ layers. Plot (a) shows the characteristic of the photodiode proposed by Capasso et.al., having the multilayer structure with 12 periods of 200 Å, graded in composition from $InGa_{0.3}Al_{0.2}As$ (Eg=1.0 eV) to InGaAs (Eg=0.75 eV) as the avalanche multiplication layer, and plot (b) shows the characteristic of the photodiode according to the present invention, having the structure with 12 periods of 200 Å, graded in composition from InAlAs (Eg=1.49 eV) to $InGa_{0.3}Al_{0.2}As$ (Eg=1.0 eV) as the avalanche multiplication layer. Dark current characteristic (a) is proportional to the second or third power of the multiplication factor "M", exhibiting a marked tunneling current characteristics, while it is understood from (b) to be a suppressed dark current proportional to "M".

As understood from FIG. 4, the dark-current reducing effects by increasing the minimum bandgap from the InGaAs (0.75 eV) three-element layer to the InGaAlAs (1.0 eV) layer surpasses the theoretical one: Since the relationship between the bandgap (Eg) and tunneling dark current (Idt) is expressed as $$Idt \propto (Eg)^{-1/2} \times exp\,(Eg)^{3/2}$$

The dark current-reducing effect associated with the above-mentioned multiplication-layer composition is expected to be about ½. FIG. 4 however demonstrates that the experimental reduction effect is improved by one or more order of magnitude from 3 μA to 60 nA. This improvement effect of the dark-current characteristic surpassing the theoretical value is mainly due to improvement in crystal quality caused by incorporation of a slight Al composition in InGaAs, and due to the thereby-marked reduction of tunneling current through the defects or levels in the InGaAlAs layer constituting the minimum bandgap.

Figure 5A:
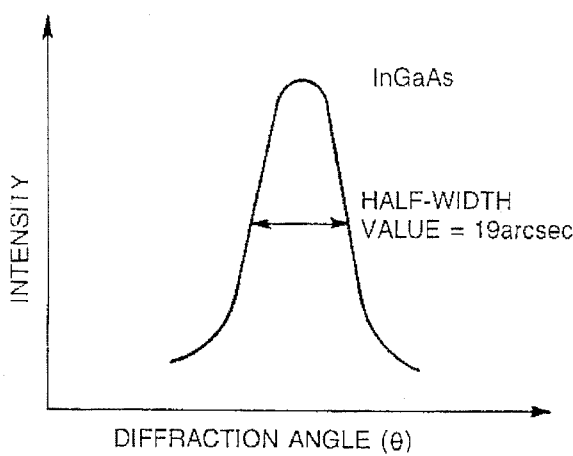
FIGS. 5A and 5B are graphs for comparison of the half-width values by X-ray diffraction for illustrating the effect of the first embodiment.
Figure 5B:
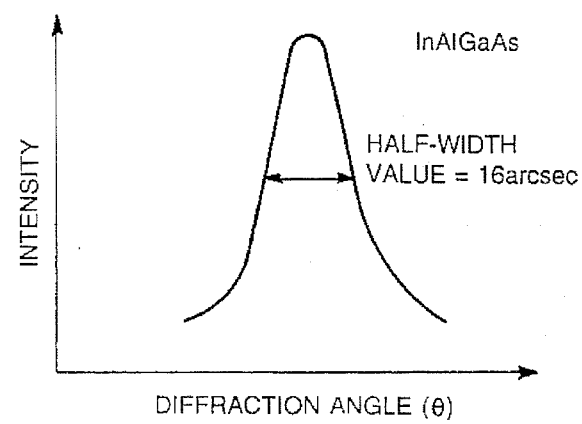

The results of X-ray diffraction analysis with the InGaAs layer and $InGa_{0.3}Al_{0.2}As$ layer are shown in FIGS. 5A and 5B, respectively. The InGaAlAs is understood to be improved in crystal quality because of the reduced half-value width compared with the InGaAs.

With the above-mentioned device structure, the advantages of reduced dark current and high multiplication factor according to the principle described in the section of the effects has been achieved. In other words, and APD photodiode has been realized which has characteristics as follows: total dark current 0.7 μA at multiplication factor 10, effective ionization rate ratio (α/β ratio) of 40, maximum band 18 GHz, low noise of quantum efficiency 70%, and high-speed response.

Figure 6:
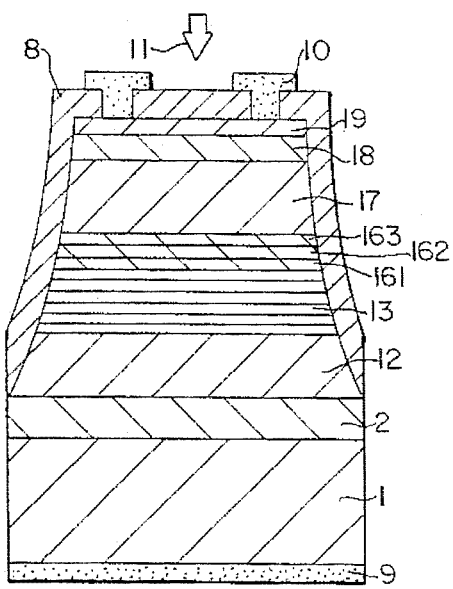
FIG. 6 is a cross-sectional view of the second embodiment of the present invention.

FIG. 6 is a cross-section of the second embodiment of the present invention.

The structure consists of, on top of one another, an n-type InP substrate 1, an n-type InP buffer layer 2 (0.5 μm thickness), an $n^+$-type InAlAs layer 12 (0.5 μm) thickness), and an avalanche multiplication multilayer 13 (0.24 μm thickness) with 12 periods of 200 Å, graded in composition from $n^-$-type InAlAs to InAlAs to $InGa_{0.3}Al_{0.2}As$. Successively an electric-field relaxation layer 16 of a triple-layer ([$n^-$-type InP layer 161 (500 Å thickness), $p^+$-type InP layer 162 (850 Å thickness) and $p^-$-type InP layer 163 (300 Å thickness)] structure, a $p^-$-type InGaAs photoabsorption layer 17 (1.3 μm thickness), an InP cap layer 18 (0.2 μm thickness), and InGaAs contact layer 19 (0.1 μm thickness) are formed. Thereafter wet-etching is made to form a mesa of 40 μm in diameter, and a passivation film 8 (1500 Å thickness) is vacuum-evaporated. Finally an n-side electrode 9 is made by deposition of AuGe/Ni (1500 Å thickness), followed by TiPtAu (500 Å thickness), and an p-side electrode 10 by deposition of AuZn (1500 Å thickness). Thus the device structure shown in FIG. 6 is completed.

With the above-mentioned device structure, the advantage of reduced dark current and high multiplication factor according to the principle described in the section of the effects has been achieved. In other words, an APD has been realized which has characteristics as follows: dark current of 70 nA at a multiplication factor 10, effective ionization rate ratio ($\alpha/\beta$ ratio) 40, maximum band 18 GHz, low noise of quantum efficiency 80%, and high-speed response.

The device structures according to the present invention can be fabricated by epitaxial-growth techniques such as MOVPE, MBE, or gas-source MBE.

A typical doping concentration of the lightly doped n⁻-InP layers 161 and 163 is about $2 \times 10^{17}$ cm$^{-3}$ and preferably it is selected to be $1 \times 10^{16}$ cm$^{-3}$ or less. The highly doped p⁺-InP layer 162 has about $5 \times 10^{17}$ cm$^{-3}$ and preferably it is selected to be $1 \times 10^{17}$ cm$^{-3}$ or more.

Figure 7:
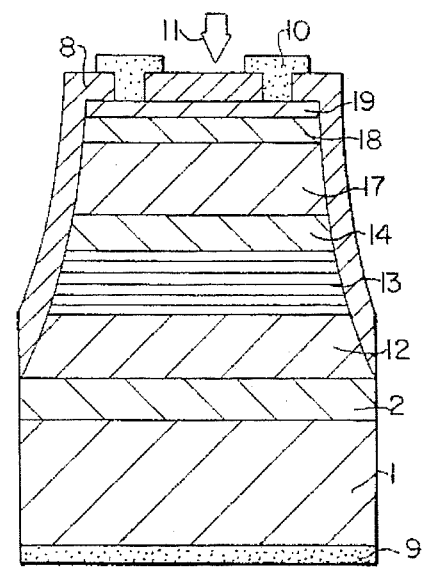
FIG. 7 is a cross-sectional view of a comparative example.

FIG. 7 is a cross-section of a comparative example.

The structure consists of, on top of one another, an n-type InP substrate 1, an n-type InP buffer layer 2 (0.5 μm thickness), an n⁺-type InAlAs layer 12 (0.5 μm thickness), and an avalanche multiplication multilayer 13 (0.24 μm thickness) with 12 periods of 200 Å, graded in composition from n⁻-type InAlAs to InGa$_{0.3}$Al$_{0.2}$As. Successively a p⁺-type InGaAs electric-field relaxation layer 14 (2000 Å thickness), a p⁻-type InGaAs photoabsorption layer 17 (0.3 μm thickness), an InP cap layer 18 (0.2 μm thickness), and InGaAs contact layer 19 (0.1 μm thickness) are formed. After this, wet-etching is made to form a mesa of 40 μm in diameter, and a passivation film 8 (1500 Å thickness) is vacuum-evaporated. Finally an n-side electrode 9 is made by deposition of AuGe/Ni (1500 Å thickness), followed by TiPtAu (500 Å thickness), and an p-side electrode 10 by deposition of AuZn (1500 Å thickness). Thus the comparative structure shown in FIG. 7 is completed.

FIG. 8 is a graph for illustrating the effects of the first and second embodiments, respectively, of the present invention. It is the measured-result comparison between the dark current characteristics associated with the under-described structures (a), (b) and (c), respectively, used as the electric-field relaxation layer of staircase APD with separate absorption and multiplication regions: (a) the comparative structure shown in FIG. 7; (b) the structure of the first embodiment of the present invention shown in FIG. 3; and (c) the structure of the second embodiment of the present invention shown in FIG. 6. A solid line (a) shows a marked tunneling current characteristic that the dark current characteristic is proportional to the second to third power of multiplication factor "M", and a solid line (b) shows a significant improvement effect that the dark current characteristic is proportional to the second power of "M". A solid line (c) shows that the dark current is proportional to a dotted line "M". This demonstrates that excessive dark current is suppressed and an ideal dark current characteristic governed by avalanche breakdown in the multiplication layer is obtained.

These results are attributed to making the tunnel breakdown in this region difficult by the use of material wider in bandgap than the photoabsorption layer as in the first-embodiment as a field relaxation layer, or to using the triple-layer structure as the electric-field relaxation layer as in the second embodiment, with the effects that the solid-layer diffusion of dopant from the highly-doped layer is prevented within the outside, lightly-doped layers, which, in turn, keeps the small-bandgap photoabsorption layer from being exposed to high electric field, with a consequent, reduced tunneling dark-current.

The material of the electric-field relaxation layer is not restricted to the InP, but other materials such as InAlGaAs, InAlAs and InGaAsP are available as far as the material having a bandgap wider than that of the photoabsorption layer by at least 200 meV. The bandgap difference therebetween is preferably selected to be 200~900 meB, more preferably, it may be chosen to be 200~720 meV.

According to the present invention which comprises an avalanche multiplication semiconductor layer of the periodic structure graded in composition from InAlAs to InGa$_x$Al$_{(1-x)}$As ($0.1<x<1$) has, compared with the conventional, proposed staircase APD, the effects of an improved crystal-quality, as well as an increased bandgap, with the resultant small dark current characteristic, thereby realizing high-sensitivity and low noise characteristics.

The first-embodiment APD according to the present invention which has a structure with separate photoabsorption and multiplication regions, consists of a photoabsorption layer, an avalanche multiplication semiconductor layer, and an electric-field relaxation layer sandwiched between them, where by the bandgap of the electric-field relaxation layer wider than that of the photoabsorption layer. This prevents tunnel breakdown with a consequent reduced dark current, which can lead to the realization of high-sensitivity and low noise characteristic.

The second embodiment APD according to the present invention has a triple-layer structure with separate photoabsorption and multiplication regions. The APD consists of a photoabsorption layer, an avalanche multiplication semiconductor layer, and an electric-field relaxation layer sandwiched between them, whereby the bandgap of the electric-field relaxation layer being wider than that of the photoabsorption layer, and additionally features the interposition of the highly-doped layer between the lightly-doped layers. This is for the purpose of preventing tunnel breakdown to reduce tunneling dark-current in the photoabsorption layer and keep the multiplication in the avalanche layer from being weakened. This means to provide the staircase APD with a practical structure with separate photoabsorption and multiplication regions, which can lead to the realization of extremely small dark current, high sensitivity and low noise characteristics together.

What is claimed is:

1. An avalanche photodiode comprising:

an electric-field relaxation layer sandwiched between a photoabsorption layer and an avalanche multiplication semiconductor layer on a semiconductor substrate, said avalanche multiplication semiconductor layer being a multilayer of periodical structure graded in composition from InAlAs to InGa$_x$Al$_{(1-x)}$As ($0.1<x<1$), said electric-field relaxation layer having a structure of a highly-doped layer sandwiched between a pair of lightly-doped layers, and a bandgap of said electric-field relaxation layer being higher than a bandgap of said photoabsorption layer.

2. An avalanche photodiode comprising:

an electric-field relaxation layer sandwiched between a photoabsorption layer and an avalanche multiplication semiconductor layer on a semiconductor substrate, said avalanche multiplication semiconductor layer being a multilayer of periodical structure graded in composition from InAlAs to InGa$_x$Al$_{(1-x)}$As ($0.1<x<1$), so as to have bandgaps ranging from 1.0 eV to 1.49 eV, wherein a bandgap of said electric-field relaxation layer is higher than a bandgap of said photoabsorption layer, and wherein said electric-field relaxation layer has a structure of a highly-doped layer sandwiched between a pair of lightly-doped layers.

3. An avalanche photodiode comprising:

an n-type InP substrate, an n-type InP buffer layer formed on said substrate, an $n^+$-type InAlAs layer formed on said buffer layer, an avalanche multiplication multilayer formed on said $n^+$-type InAlAs layer, said multilayer having a periodic multilayer structure graded in composition from $n^-$-type InAlAs to $InGa_xAs_{(1-x)}As$, an $n^-$-type InP layer formed on said multilayer, a $p^+$-type InP layer formed on said $n^-$-type InP layer, a $p^-$-type InP relaxation layer formed on said $p^+$-type InP layer, a $p^-$-type InGaAs photoabsorption layer formed on said relaxation layer, an InP cap layer formed on said photoabsorption layer, an InGaAs contact layer formed on said cap layer, and electrode layers formed on said contact layer and a rear surface of said substrate, respectively.

4. An avalanche photodiode comprising:

a) an n-type InP substrate, b) an n-type InP buffer layer formed on said substrate, c) an $n^+$-type InAlAs layer formed on said buffer layer, d) an avalanche multiplication multilayer formed on said $n^+$-type InAlAs layer, said multilayer having a periodic multilayer structure graded in composition from $n^-$-type InAlAs to $InGa_xAs_{(1-x)}As$ so as to have band-gaps ranging from 1.0 eV to 1.49 eV, e) an InP electric-field relaxation layer formed on said multilayer, wherein said relaxation layer includes:

e1) an $n^-$-type InP layer formed on said multilayer, e2) a $^+$-type InP layer formed on said $n^-$-type InP layer, and e3) a $p^-$-type InP layer formed on said $p^+$-type InP layer, f) a $p^-$-type InGaAs photoabsorption layer formed on said relaxation layer, g) an InP cap layer formed on said photoabsorption layer, h) an InGaAs contact layer formed on said cap layer, and i) electrode layers formed on said contact layer and a rear surface of said substrate, respectively.

\* \* \* \* \*